United States Patent [19]

Theus

[11] Patent Number: 4,691,121

[45] Date of Patent: Sep. 1, 1987

[54] DIGITAL FREE-RUNNING CLOCK SYNCHRONIZER

[75] Inventor: John G. Theus, Portland, Oreg.

[73] Assignee: Tektronix, Inc., Beaverton, Oreg.

[21] Appl. No.: 803,262

[22] Filed: Nov. 29, 1985

[51] Int. Cl.⁴ .......................... H03K 5/13; H03K 19/00
[52] U.S. Cl. ..................................... 307/269; 307/480; 328/63; 328/72
[58] Field of Search ................. 307/269, 480, 590; 328/14, 63, 72; 331/51, 1 A, 55, 1 R; 375/106, 110

[56] References Cited

U.S. PATENT DOCUMENTS

| | | | |
|---|---|---|---|
| 4,105,978 | 8/1978 | Goss et al. | 307/269 |
| 4,134,073 | 1/1979 | MacGregor | 328/63 |
| 4,426,713 | 1/1984 | Shimizu et al. | 328/63 |
| 4,544,914 | 10/1985 | Chan et al. | 328/63 |

*Primary Examiner*—Stanley D. Miller
*Assistant Examiner*—Timothy P. Callahan
*Attorney, Agent, or Firm*—John P. Dellett; Robert S. Hulse

[57] ABSTRACT

A digital free-running clock oscillator comprises a circuit synchronizing the operation of the oscillator with an asynchronous timing signal from an external source, and is provided with a protection circuit for preventing a logic race condition in the synchronizing circuit during a period of coincident transition of the oscillator output and the external timing signal.

6 Claims, 5 Drawing Figures

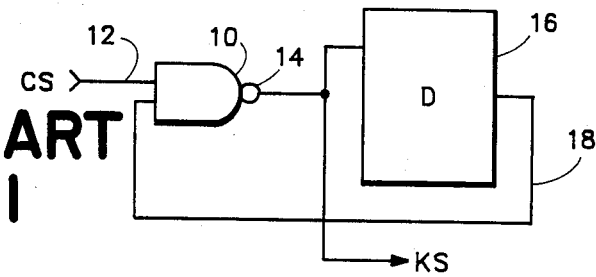
PRIOR ART FIG. 1
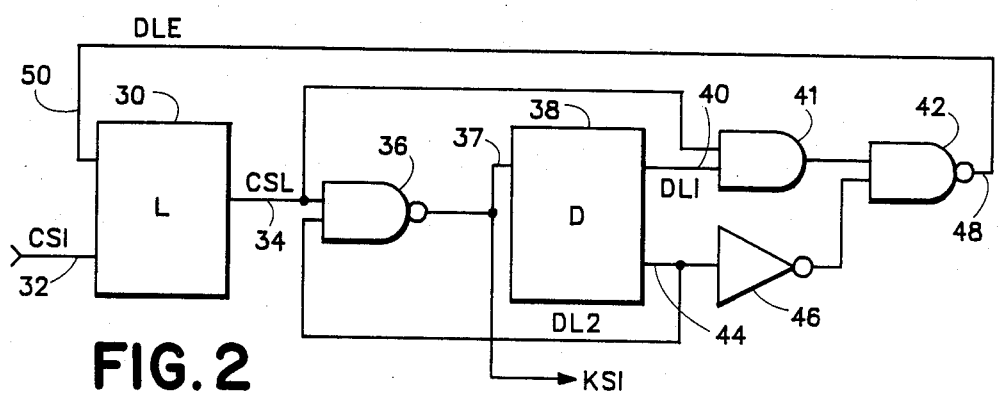
FIG. 2
FIG. 4
FIG. 5

DIGITAL FREE-RUNNING CLOCK SYNCHRONIZER

BACKGROUND OF THE INVENTION

The invention relates to oscillators, and more particularly to a free-running oscillator synchronized with an external asynchronous pulse.

Computer systems are required to work efficiently with data stores of different speeds within the same system. If a semiconductor data store is used, the characteristics of the dynamic storage devices require that data in the storage elements be refreshed periodically. If store refresh operations are accomplished internally of the data store, the response time of the store will vary, and, accordingly, fully synchronous operation of a data store and the system central processor is not practical or desirable. Nevertheless, data transfer between the two units must be synchronized. One means of effecting synchronization between asynchronously operating units of a computer system involves resynchronization or restarting of a clock signal source of one unit, for example a free-running oscillator forming a part of such unit, with a clock signal from another unit. However, clock synchronizing circuits using logic gates are particularly susceptible to logic race conditions inasmuch as the asynchronous clock signals of the various units of the system drift with respect to each other. Such logic race conditions can result in the generation of clock signals having pulse widths of insufficient duration for proper system operation.

Accordingly, it is an object of the invention to provide an improved synchronizing circuit for a free-running clock signal generator.

Another object of the invention is to provide an improved free-running clock signal generator having a digital logic circuit for synchronizing the generation of the clock signals with an asynchronous clock signal from an external source.

Another object of the invention is to provide an improved digital-logic clock signal synchronizing circuit which provides protection against logic race conditions.

SUMMARY OF THE INVENTION

In accordance with the present invention, a free-running clock signal oscillator comprises a logic element supplying a clock-signal output connected in driving relation to a precision delay line, wherein the output of the delay line is connected back to the input of the logic element whereby the delay line serves as the timing element of the oscillator. The logic element also receives as an input a control signal from an asynchronously operating external source with which the clock signal output is to be synchronized. This control signal turns the oscillator on and off, thereby synchronizing the operation of the oscillator with the control signal. The control signal is coupled to the aforementioned logic element through a logic-race protection circuit which prevents a transition of the control signal when the clock signal output is in transition and when a potential logic-race condition exists in the logic element of the oscillator.

BRIEF DESCRIPTION OF THE DRAWINGS

While the invention is set forth particularity in the appended claims, other objects, features, the organization and method of operation of the invention will become more apparent, and the invention will best be understood, by referring to the following detailed description in conjunction with the accompanying drawings in which:

FIG. 1 is a logic diagram of a free-running clock signal generator of the type utilized in the present invention;

FIG. 2 is a logic diagram of a free-running clock signal generator in accordance with the instant invention; and FIGS. 3, 4 and 5 are timing diagrams useful in explaining the operation of the present invention.

DESCRIPTION OF THE PREFERRED EMBODIMENT

Figure 3:
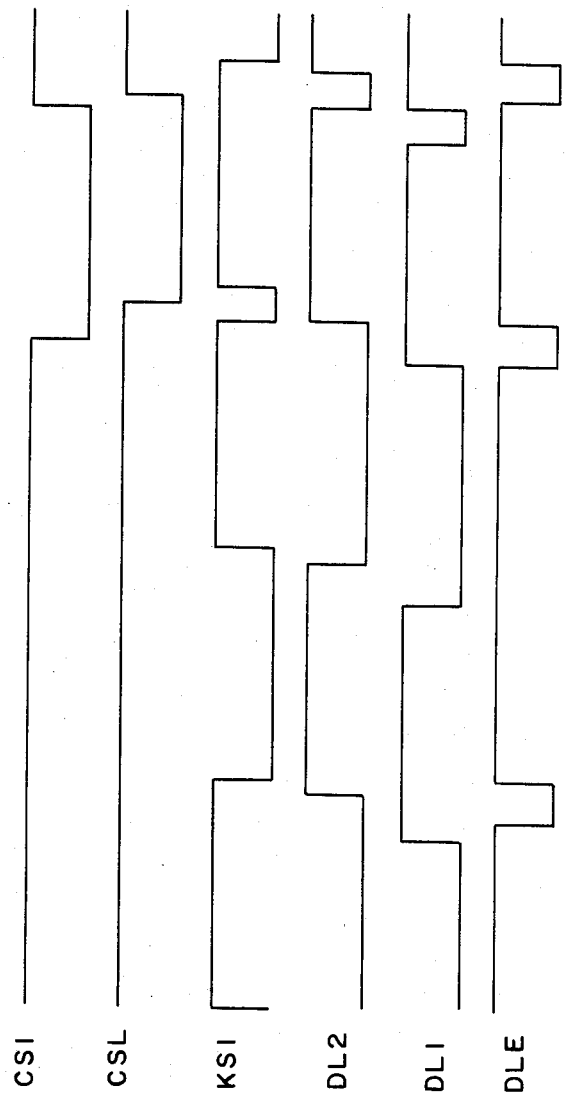

Referring now to the drawings for a more detailed description of the construction, operation and other features of the instant invention by characters of reference, FIG. 1 shows a free-running oscillator circuit comprising a NAND logic element or gate 10 having an input terminal 12 receiving an asynchronous control signal CS. An output terminal 14 of the NAND gate 10 is connected to an input terminal of a delay element 16 having a time delay of T2, while an output 18 of the delay element 16 is connected as a second input of the NAND gate 10. When the CS control signal is enabled or high, the oscillator runs but when the CS signal is disabled or low, the oscillator output signal KS at the output terminal 14 of the NAND gate 10 remains high. The CS control signal therefore turns the oscillator output with the rising edge of the CS signal. A first transition from high to low of the KS output signal follows the transition of the CS control signal from low to high by one gate delay, the delay of the NAND logic element 10. Subsequent transitions of the KS clock signal occur after delay T2 plus the gate delay of the NAND gate 10. The oscillator circuit of FIG. 1 represents the prior art which has a disadvantage of possible unstable operation due to a logic race condition when the CS control signal changes state at the same time the KS output of the NAND gate 10 changes. At such time a KS clock signal having less than acceptable pulse width can occur.

Referring now to FIG. 2 in conjunction with the timing diagrams of FIGS. 3 and 4, a free-running clock synchronizer circuit in accordance with the present invention includes a transparent latch circuit 30 receiving a CS1 control signal on an input terminal 32. The latch circuit 30 may comprise a conventional storage element such as a D bistable or flip-flop. An output terminal 34 of the latch circuit 30, signal CSL, is connected as one input of a NAND logic element or gate 36, the output of which is the clock signal KS1. Clock signal KS1 is coupled to input terminal 37 of delay line 38 adapted to produce a first output at tap 40 after a time delay T1. This first output at tap 40 of the delay line 38, signal DL1, is connected as a first input of an AND gate 41 while a second output tap 44 of the delay line 38, signal DL2, is connected as a second input of the NAND gate 36. The delay at the second output tap 44 of the delay line 38 is T2, T2 being greater than T1. The CSL signal is connected as a second input of the AND gate 41, an output of which is supplied as a first input of a NAND gate 42. Tap 44 of the delay line 38 further provides a second input to NAND gate 42 via an inverter 46, and NAND gate 42 supplies a signal DLE at terminal 48 which is connected to a latch-enable input 50 of the latch circuit 30.

The KS1 signal output of the NAND gate 36 is a square wave clock signal with a period 2(T2+D1) where D1 is the gate delay of the NAND gate 36. The latch circuit 30 functions normally as a transparent logic element that passes the CS1 control signal directly, with only one gate delay, to the NAND gate 36 as control signal CSL on terminal 34. The CSL signal gates the KS1 oscillator output signal off and on so the oscillator output signal is synchronized with the SC1 control signal.

The enabling (high) output at terminal 48 of the NAND gate 42 normally enables the latch circuit 30 to pass the CS1 control signal as the CSL signal. But after the positive portion of the KS1 signal has traversed the delay line 38 and appears at the T1 output tap 40 as the DL1 signal, the CSL and DL1 signals enable the AND gate 41 which causes the DLE signal output at terminal 48 of the NAND gate 42 to go low for a period T2−T1 and disable latch 30, i.e. when a positive-to-negative transition of the KS1 signal may occur. As shown in FIG. 3, the CS1 signal might also be in transition from high to low during such period. The disabled latch circuit 30 then protects the oscillator circuit from an undefined or unstable logic condition of NAND gate 36 caused by the CS1 control signal changing state at or near the same time the KS1 output of the NAND gate 36 changes. In particular, the latch circuit 30 prevents KS1 from returning immediately to a positive level until after the DLE signal concludes and latch 30 generates the falling edge of CSL. The circuit output is then synchronized with the rising edge of the CSL signal so that delaying the generation of the falling edge of the CSL signal does not adversely affect circuit operation. It is seen, however, that the circuit is prevented from generating pulses shorter than a given duration.

FIG. 4 is an expansion of the potentially unstable period when the DLE signal is low, and shows the gate delays associated with the generation of a minimum-width negative transition of the KS1 clock signal. The protection circuit comprising the gates 41, 42, 46 and the latch circuit 30 ensures that a negative portion of the KS1 signal will have a length of at least three gate delays.

Referring to FIG. 5, if the CSL signal is in the logic low state when the DL1 signal goes true, the AND gate 41 is disabled and the DLE signal output on terminal 48 is inhibited from going low thereby preventing the latch circuit 30 from closing when the CS1 signal is in transition from low to high.

While the principles of the invention are clear in reference to the foregoing illustrative embodiment, there will be immediately obvious to those skilled in the art many modifications of structure, arrangement, and components used in the practice of the invention, and otherwise, which are particularly adapted for specific environments and operating requirements without departing from those principles. The appended claims are, therefore, intended to cover and embrace any such modifications, within the limits only of the true spirit and scope of the invention.

I claim:

1. An oscillator circuit, comprising:
   a coincidence logic element comprising a NAND gate having a first input receiving a control signal, a second input, and an output, the control signal having first and second logic states;
   a delay element having an input terminal connected to the output of said coincidence logic element, and a first output terminal connected to the second input of said coincidence logic element, said delay element passing a signal on the input terminal to the first output terminal after a delay T2, the control signal in the first logic state enabling said coincidence logic element to regenerate on the output thereof a complement of the signal on the second input, thereby generating on the output of said coincidence logic element a square wave output signal of said oscillator circuit having a period 2(T2+D) where D is a gate delay of the NAND gate, the control signal in the second logic state disabling said coincidence logic element;
   a latch circuit receiving an asynchronous timing signal from an external source and having an enabling input, said latch circuit, when enabled, regenerating the asynchronous timing signal as the control signal; and
   a logic element having an output connected to the enabling input of said latch circuit, said delay element having a second ouput terminal passing the signal on the input terminal after a delay T1 where T1<T2, said logic element receiving the signals at said first and second output terminals of said delay element and generating an enabling output signal, the enabling output signal being disabled during a period of positive to negative transition of the square wave output signal.

2. A clock synchronizer circuit, comprising:
   a free-running clock signal generator including
      a delay element having a first delay period, an input terminal and an output terminal, and
      first logic means having an enabling input and receiving a signal from the output terminal of said delay element for inverting said signal, said inverted signal being provided to the input terminal of said delay element, said inverted signal being an output clock signal having a period at least twice the first delay period;
   a source of an asynchronous timing signal;
   means receiving the asynchronous timing signal and connected to the enabling input of said first logic means for generating a control signal synchronizing the output clock signal with the asynchronous timing signal; and
   second logic means coupled intermediate said delay element and said control signal generating means, said second logic element receiving the signal from the output terminal of said delay element and providing a signal to said control signal generating means for preventing a logic race condition in said first logic means during a transition period of the output clock signal.

3. The clock synchronizer circuit of claim 2, wherein said first logic means comprises a first NAND gate and said second logic means comprises a second NAND gate.

4. The clock synchronizer circuit of claim 2, wherein said second logic means includes a coincidence circuit detecting the transition period of the output clock signal, the control signal being inhibited by the output of the coincidence circuit during the transition period of the output clock signal.

5. A clock synchronizing circuit, comprising:
   a free-running oscillator including a first NAND logic element having a first input receiving a control signal, a second input and an output, the control signal having first and second logic states; and a delay element having an input terminal connected to the output of said first NAND logic element, and a first output terminal connected to the second input of said first NAND logic element, said delay element passing a signal on the input terminal thereof to the first output terminal after a delay T2, the control signal in the first logic state enabling said first NAND logic element to generate on the output thereof a square wave output signal having a period 2(T2+D) where D is a gate delay of said first NAND logic element, the control signal in the second logic state disabling said first NAND logic element; and a circuit synchronizing the square wave output signal with an asynchronous timing signal from an external source including a latch circuit having a first input receiving the asynchronous timing signal and an enabling input, said latch circuit, when enabled, regenerating the asynchronous timing signal as the control signal; and a second NAND logic element having an output connected to the enabling input of said latch circuit and first and second inputs, said delay element having a second output terminal passing the signal on the input terminal of said delay element after a delay T1 where T1<T2, the first and second inputs of said second NAND logic element being coupled respectively to the first and second output terminals of said delay element, said second NAND logic element generating an enabling output signal, the enabling output signal being disabled during a period of positive to negative transition of the square wave output signal, thereby preventing a logic race condition in said first NAND logic element.

6. The clock synchronizing circuit of claim 5, further comprising an AND logic element having an output connected to the second input of said second NAND logic element, a first input receiving the control signal and a second input connected to the second output of said delay element, said AND logic element inhibiting the disabling of the enabling output signal of said second NAND logic element when the control signal is in transition from the second logic state to the first logic state.

* * * * *